(12) United States Patent
Cok et al.

(10) Patent No.: US 8,456,387 B2
(45) Date of Patent: *Jun. 4, 2013

(54) DISPLAY DEVICE WITH CHIPLET DRIVERS

(75) Inventors: Ronald S. Cok, Rochester, NY (US); John W. Hamer, Rochester, NY (US)

(73) Assignee: Global OLED Technology LLC, Herndon, VA (US)

( * ) Notice: Subject to any disclaimer, the term of this patent is extended or adjusted under 35 U.S.C. 154(b) by 910 days.

This patent is subject to a terminal disclaimer.

(21) Appl. No.: 12/372,906

(22) Filed: Feb. 18, 2009

(65) Prior Publication Data

US 2010/0207849 A1    Aug. 19, 2010

(51) Int. Cl.
*G09G 3/30*    (2006.01)
*G09G 3/32*    (2006.01)

(52) U.S. Cl.
USPC ............................... 345/76; 345/204; 345/82

(58) Field of Classification Search
USPC ............................................ 345/204, 76, 82
See application file for complete search history.

(56) References Cited

U.S. PATENT DOCUMENTS

| | | | |
|---|---|---|---|
| 4,769,292 A | 9/1988 | Tang et al. | |
| 5,061,569 A | 10/1991 | VanSlyke et al. | |
| 6,384,529 B2 | 5/2002 | Tang | |
| 6,919,681 B2 | 7/2005 | Cok et al. | |
| 6,987,355 B2 | 1/2006 | Cok | |
| 7,230,594 B2 | 6/2007 | Miller et al. | |
| 7,585,703 B2 * | 9/2009 | Matsumura et al. | 438/128 |
| 7,710,022 B2 * | 5/2010 | Cok et al. | 313/505 |
| 7,830,002 B2 * | 11/2010 | Cok et al. | 257/723 |
| 7,999,454 B2 * | 8/2011 | Winters et al. | 313/500 |
| 8,125,418 B2 * | 2/2012 | Cok | 345/76 |
| 8,207,954 B2 * | 6/2012 | Cok et al. | 345/205 |
| 8,267,954 B2 * | 9/2012 | Decant et al. | 606/200 |
| 2002/0053881 A1 * | 5/2002 | Odake et al. | 315/169.1 |
| 2004/0239586 A1 * | 12/2004 | Cok | 345/55 |
| 2006/0055864 A1 | 3/2006 | Matsumura et al. | |
| 2007/0057263 A1 | 3/2007 | Kahen | |
| 2010/0039030 A1 * | 2/2010 | Winters et al. | 313/505 |
| 2010/0109166 A1 * | 5/2010 | Cok et al. | 257/776 |
| 2010/0123694 A1 * | 5/2010 | Cok et al. | 345/206 |
| 2010/0201275 A1 * | 8/2010 | Cok et al. | 315/158 |
| 2010/0207848 A1 * | 8/2010 | Cok | 345/76 |
| 2010/0207851 A1 * | 8/2010 | Cok et al. | 345/82 |
| 2010/0207852 A1 * | 8/2010 | Cok | 345/83 |

(Continued)

OTHER PUBLICATIONS

Yoon et al, A novel use of MEMS switches in driving AMOLED, Digest of Technical Papers of the Society for Information Display, 2008, 3.4, p. 13.

*Primary Examiner* — Bipin Shalwala
*Assistant Examiner* — Afroza Chowdhury
(74) *Attorney, Agent, or Firm* — Global OLED Technology LLC

(57) ABSTRACT

A display device, including a substrate; a first layer having an array of row electrodes formed in rows across the substrate in a first direction and a second layer having an array of column electrodes formed in columns across the substrate in a second direction different from the first direction wherein the row and column electrodes overlap to form pixel locations; one or more layers of light-emitting material formed between the row and column electrodes to form a two-dimensional array of pixels, the pixels being located in the pixel locations; and a plurality of chiplets located over the substrate, the number of chiplets being less than the number of pixels, each chiplet exclusively controlling a subset of row electrodes and a subset of column electrodes, whereby the pixels are controlled to display an image.

17 Claims, 13 Drawing Sheets

U.S. PATENT DOCUMENTS

2010/0265224 A1* 10/2010 Cok .............................. 345/206
2010/0277440 A1* 11/2010 Cok .............................. 345/204
2010/0309100 A1* 12/2010 Cok et al. ........................ 345/76
2010/0328196 A1* 12/2010 Cok ................................ 345/76

* cited by examiner

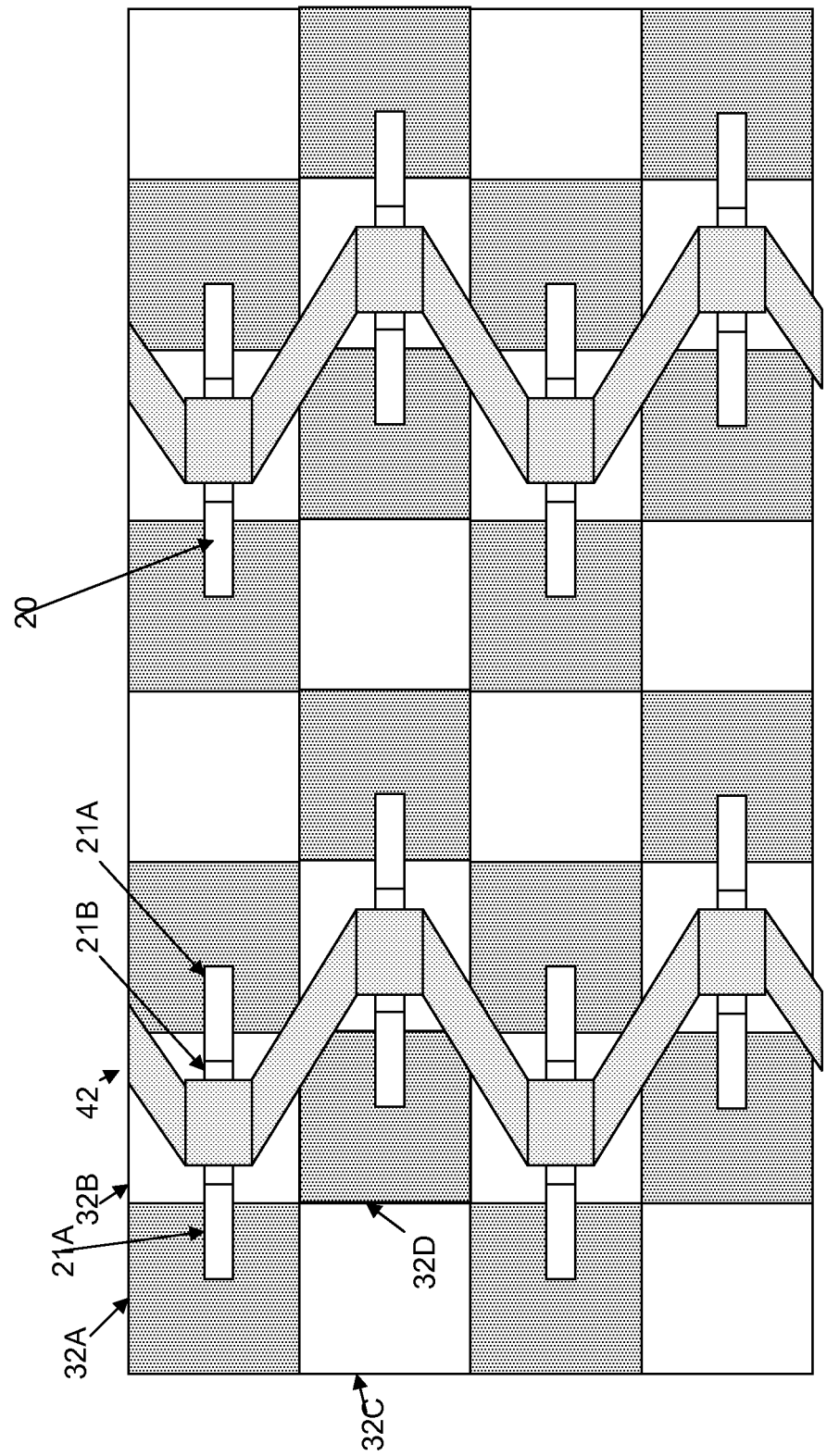

DISPLAY DEVICE WITH CHIPLET DRIVERS

FIELD OF THE INVENTION

The present invention relates to display devices having a substrate with distributed, independent chiplets for controlling a pixel array.

BACKGROUND OF THE INVENTION

Flat-panel display devices are widely used in conjunction with computing devices, in portable devices, and for entertainment devices such as televisions. Such displays typically employ a plurality of pixels distributed over a substrate to display images. Each pixel incorporates several, differently colored light-emitting elements commonly referred to as sub-pixels, typically emitting red, green, and blue light, to represent each image element. As used herein, pixels can refer to a single light-emitting element or a group of differently colored light-emitting elements. A variety of flat-panel display technologies are known, for example plasma displays, liquid crystal displays, and light-emitting diode (LED) displays.

Light emitting diodes (LEDs) incorporating thin films of light-emitting materials forming light-emitting elements have many advantages in a flat-panel display device and are useful in optical systems. U.S. Pat. No. 6,384,529 2 to Tang et al. shows an organic LED (OLED) color display that includes an array of organic LED light-emitting elements. Alternatively, inorganic materials can be employed and can include phosphorescent crystals or quantum dots in a polycrystalline semiconductor matrix. Other thin films of organic or inorganic materials can also be employed to control charge injection, transport, or blocking to the light-emitting-thin-film materials, and are known in the art. The materials are placed upon a substrate between electrodes, with an encapsulating cover layer or plate. Light is emitted from a pixel when current passes through the light-emitting material. The frequency of the emitted light is dependent on the nature of the material used. In such a display, light can be emitted through the substrate (a bottom emitter) or through the encapsulating cover (a top emitter), or both.

LED devices can include a patterned light-emissive layer wherein different materials are employed in the pattern to emit different colors of light when current passes through the materials. Alternatively, one can employ a single emissive layer, for example, a white-light emitter, together with color filters for forming a full-color display, as is taught in U.S. Pat. No. 6,987,355 by Cok. It is also known to employ a white sub-pixel that does not include a color filter, for example, as taught in U.S. Pat. No. 6,919,681 by Cok et al. This and other disclosures teach a design employing an unpatterned white emitter together with a four-color pixel including red, green, and blue color filters and sub-pixels and an unfiltered white sub-pixel to improve the efficiency of the device (see, e.g. U.S. Pat. No. 7,230,594 to Miller, et al).

Two different methods for controlling the pixels in a flat-panel display device are generally known: active-matrix control and passive-matrix control. In a passive-matrix device, the substrate does not include any active electronic elements (e.g. transistors). An array of row electrodes and an orthogonal array of column electrodes in a separate layer are formed over the substrate; the intersections where the row and column electrodes overlap form the electrodes of a light-emitting diode. External driver chips then sequentially supply current to each row (or column) while the orthogonal column (or row) supplies a suitable voltage to illuminate each light-emitting diode in the row (or column). Therefore, a passive-matrix design employs 2n connections to produce $n^2$ separately controllable light-emitting elements. However, a passive-matrix drive device is limited in the number of rows (or columns) that can be included in the device since the sequential nature of the row (or column) driving creates flicker. If too many rows are included, the flicker can become perceptible. Moreover, the currents necessary to drive an entire row (or column) in a display can be problematic and the power required for the non-imaging pre-charge and discharge steps of PM driving become dominant as the area of the PM display grows. These two problems limit the physical size of a passive-matrix display.

In an active-matrix device, active control elements are formed of thin-films of semiconductor material, for example amorphous or poly-crystalline silicon, distributed over the flat-panel substrate. Typically, each sub-pixel is controlled by one control element and each control element includes at least one transistor. For example, in a simple active-matrix organic light-emitting (OLED) display, each control element includes two transistors (a select transistor and a drive transistor) and one capacitor for storing a charge specifying the luminance of the sub-pixel. Each light-emitting element typically employs an independent control electrode and a common electrode. Control of the light-emitting elements is typically provided through a data signal line, a select signal line, a power connection and a ground connection. Active-matrix elements are not necessarily limited to displays and can be distributed over a substrate and employed in other applications requiring spatially distributed control. The same number of external control lines (except for power and ground) can be employed in an active-matrix device as in a passive-matrix device. However, in an active-matrix device, each light-emitting element has a separate driving connection from a control circuit and is active even when not selected for data deposition so that flicker is eliminated.

One common, prior-art method of forming active-matrix control elements typically deposits thin films of semiconductor materials, such as silicon, onto a glass substrate and then forms the semiconductor materials into transistors and capacitors through photolithographic processes. The thin-film silicon can be either amorphous or polycrystalline. Thin-film transistors (TFTs) made from amorphous or polycrystalline silicon are relatively large and have lower performance compared to conventional transistors made in crystalline silicon wafers. Moreover, such thin-film devices typically exhibit local or large-area non-uniformity across the glass substrate that results in non-uniformity in the electrical performance and visual appearance of display employing such materials.

Employing an alternative control technique, Matsumura et al., in U.S. Patent Application Publication No. 2006/0055864, describe crystalline silicon substrates used for driving LCD displays. The application describes a method for selectively transferring and affixing pixel-control devices made from first semiconductor substrates onto a second planar display substrate. Wiring interconnections within the pixel-control device and connections from busses and control electrodes to the pixel-control device are shown.

Since a conventional passive-matrix display design is limited in size and number of light-emitting elements, and an active-matrix design using TFTs has lower electrical performance, there is a need for improved control for display devices employing LEDs that overcomes these problems.

SUMMARY OF THE INVENTION

In accordance with the present invention, there is provided a display device, comprising:
(a) a substrate;
(b) a first layer having an array of row electrodes formed in rows across the substrate in a first direction and a second layer having an array of column electrodes formed in columns across the substrate in a second direction different from the first direction wherein the row and column electrodes overlap to form pixel locations;
(c) one or more layers of light-emitting material formed between the row and column electrodes to form a two-dimensional array of pixels, the pixels being located in the pixel locations; and
(d) a plurality of chiplets located over the substrate, the number of chiplets being less than the number of pixels, each chiplet exclusively controlling a subset of row electrodes and a subset of column electrodes, whereby the pixels are controlled to display an image.

The present invention has the advantage that, by providing a display device with chiplet drivers having row and column electrode connections, the number of connection pads and the size and number of chiplets are reduced. In an embodiment of the present invention, a plurality of arrays provides reduced flicker and power requirements. Another advantage of the present invention is that, by providing large spaces on the display substrate for wiring, larger wires can be employed at lower cost and with higher electrical performance. A further advantage is that the monocrystalline silicon chiplets have high mobility and uniformity.

BRIEF DESCRIPTION OF THE DRAWINGS

FIG. 12A is an illustration of multiple chiplets and busses located in a serpentine fashion over a substrate, according to an embodiment of the present invention;

Figure 1A:
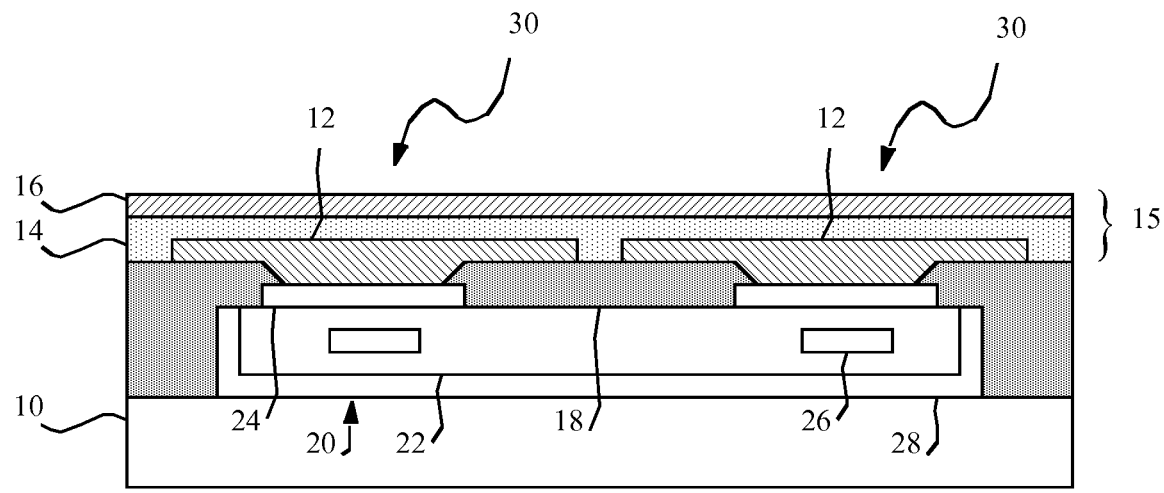
FIG. 1A is a cross sectional view of a chiplet taken along the lines 1A-1A of FIG. 2 having two connections to the bottom electrode of a light-emitting diode according to an embodiment of the present invention.

Because the various layers and elements in the drawings have greatly different sizes, the drawings are not to scale.

DETAILED DESCRIPTION OF THE INVENTION

Figure 3A:
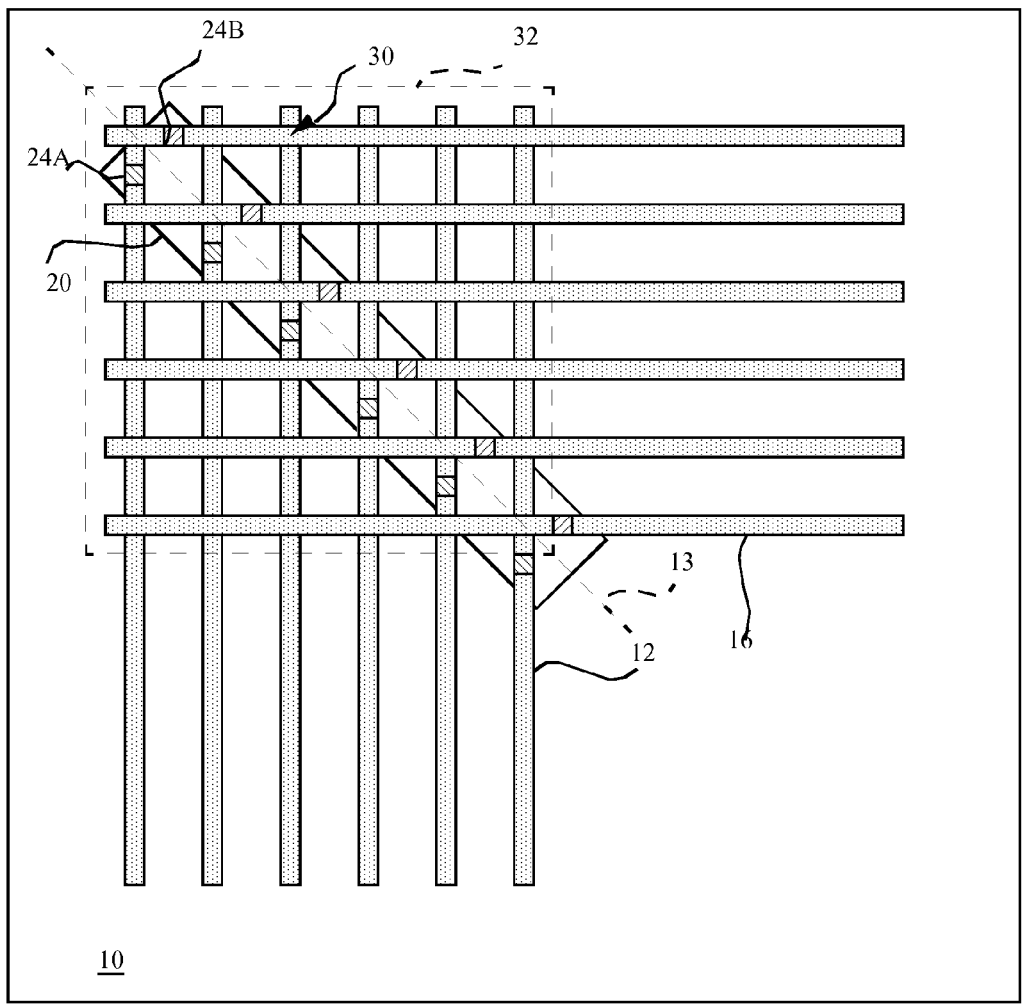
FIGS. 3A and 3B are schematics of a display device having row and column electrodes and a diagonally oriented chiplet according to an embodiment of the present invention.

Referring to FIG. 3A, in one embodiment, the present invention includes a display device including a substrate 10, a first layer having an array of row electrodes 16 formed in rows across the substrate 10 in a first direction and a second layer having an array of column electrodes 12 formed in columns across the substrate 10 in a second direction different from the first direction and wherein the first and second electrodes overlap to form pixel locations 30. Referring also to FIG. 1A, one or more layers 14 of light-emitting material are formed between the row and column electrodes 16, 12. Light-emitting diodes 15 are pixels 30 that form a two-dimensional array 32 of pixels in the pixel locations and emit light when a current is passed through the light-emitting layer 14 from the row and column electrodes 16, 12. A plurality of chiplets 20 are located over the substrate 10, the number of chiplets 20 being less than the number of pixels 30, each chiplet 20 exclusively controlling a subset of row electrodes 16 and a subset of column electrodes 12 so that the pixels are controlled to display an image. Each chiplet has a substrate 28 that is independent and separate from the display device substrate 10. In this disclosure, a pixel, sub-pixel, and light-emitting element all refer to a light-emitting diode 15.

Each chiplet 20 can include circuitry 22 for controlling the pixels 30 to which the chiplet 20 is connected through connection pads 24. The circuitry 22 can include storage elements 26 that store a value representing a desired luminance for each pixel 30 to which the chiplet 20 is connected in a subset row or column, the chiplet 20 using such value to control the row electrodes 16 or column electrodes 12 connected to the pixel 30, to activate the pixel 30 to emit light. For example, if a chiplet 20 is connected to a subset of 8 rows and 8 columns, eight storage elements 26 can be employed to store luminance information for eight rows or columns. Each time a new row or column is activated, a new subset of luminance information can be supplied to the chiplet 20. In one embodiment of the present invention, two storage elements 26 can be employed for each subset row or column, so that luminance information can be stored in one of the storage elements 26 while the other storage element 26 is employed to display luminance information. In yet another embodiment of the present invention, one or two storage elements 26 can be employed for each light-emitting element 30 to which the chiplet 20 is connected.

Figure 1B:
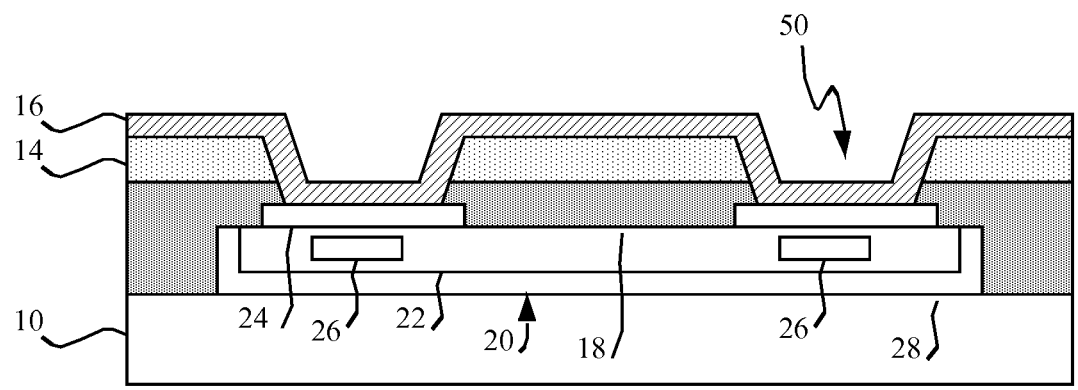
FIG. 1B is a cross sectional view of a chiplet taken along the lines 1B-1B of FIG. 2 having two connections to the top electrode of a light-emitting diode according to an embodiment of the present invention.
Figure 2:
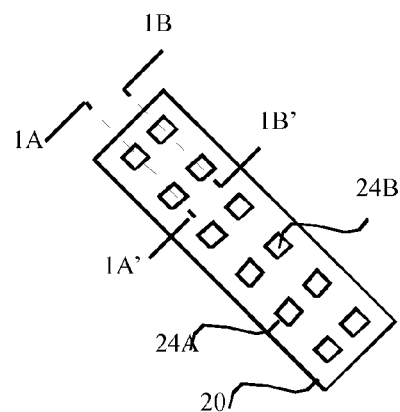
FIG. 2 is a plan schematic view of a diagonally oriented chiplet having connection pads according to an embodiment of the present invention.
Figure 3B:
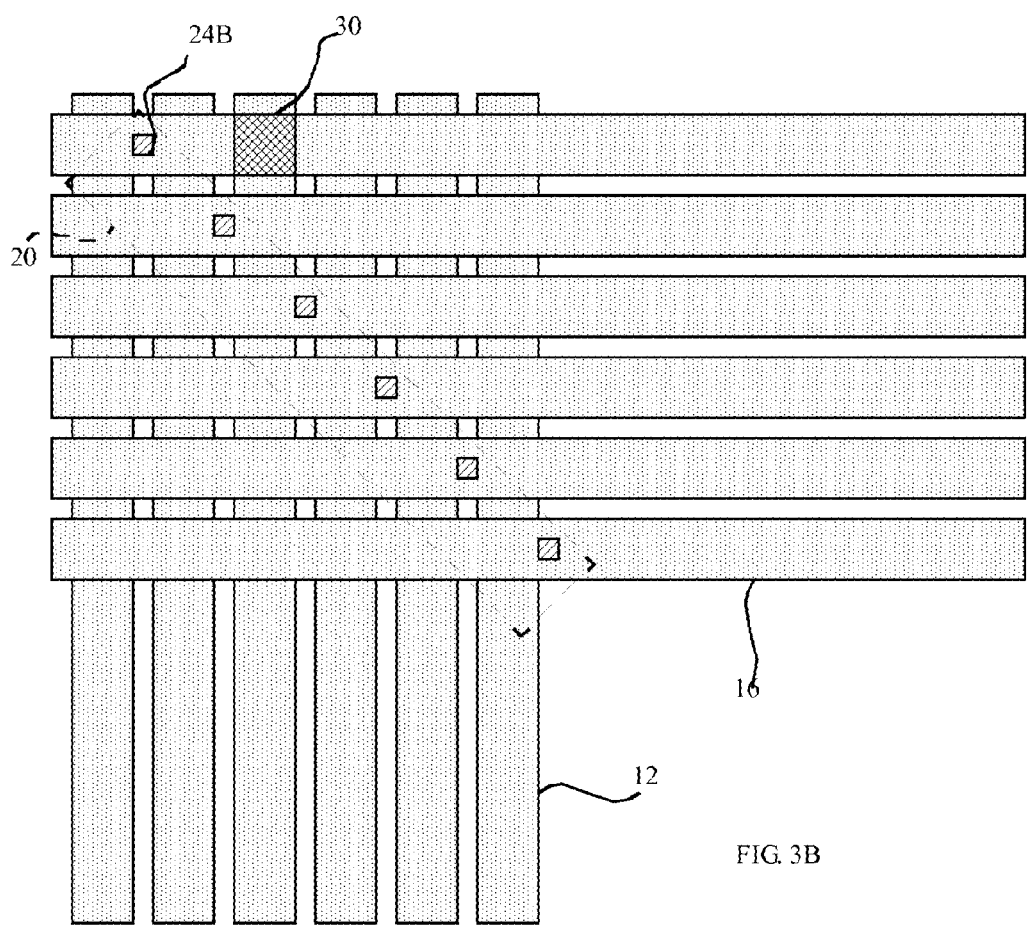

A planarization layer 18 can be employed to form a smooth surface over which the row and column electrodes 16, 12, and the light-emitting layer 14 can be formed. As shown in FIG. 1A, the connection pads 24 of the chiplet 20 can connect to the bottom electrode of the light-emitting diode 15, here shown as the column electrode 12 and indicated with cross section line 1A-1A' in FIG. 2. Alternatively, as shown in FIG. 1B, the connection pads 24 of the chiplet 20 can connect to the top electrode of the light-emitting diode, here shown as the row electrode 16 and indicated with cross section line 1B-1B' in FIG. 2. In this way, the connection pads of chiplet 20 can connect to either row electrodes 16 or column electrodes 12. In FIG. 2 the connection pads 24 of chiplet 20 are distinguished as column connection pads 24A connected to column electrodes 16 and row connection pads 24B connected to row electrodes 16. Hence, in one embodiment of the present invention, the chiplets 20 have two rows (25A and 25B in FIG. 10B) of connection pads 24, one row of connection pads 24A connected to corresponding row electrodes 16 and the other row of connection pads 24B connected to corresponding column electrodes 12. As shown in FIG. 3, however, the row and column electrode pads 24A and 24B are laid out on the substrate 10 to avoid electrical shorts between the row and column electrodes 16, 12, by providing enough space between the column connection pads 24A and the row electrodes 16 and by providing enough space between the row connection pads 24B and the column electrodes 12. FIG. 3A is a simplified figure drawn for illustrative purposes. In an exemplary embodiment shown in FIG. 3B, the column connection pad 24A (not shown) can be covered with the row electrode 16 to increase the overlapping area defining the pixel 30, thereby increasing the aperture ratio of the display device and the lifetime of the display. Depending on the tolerances of the manufacturing process used to construct a display device of the present invention, the column electrodes 12 can be increased in size so long as there is not an electrical short between the column electrodes 12 and the row connection pads 24B and row electrodes 16.

Figure 4:
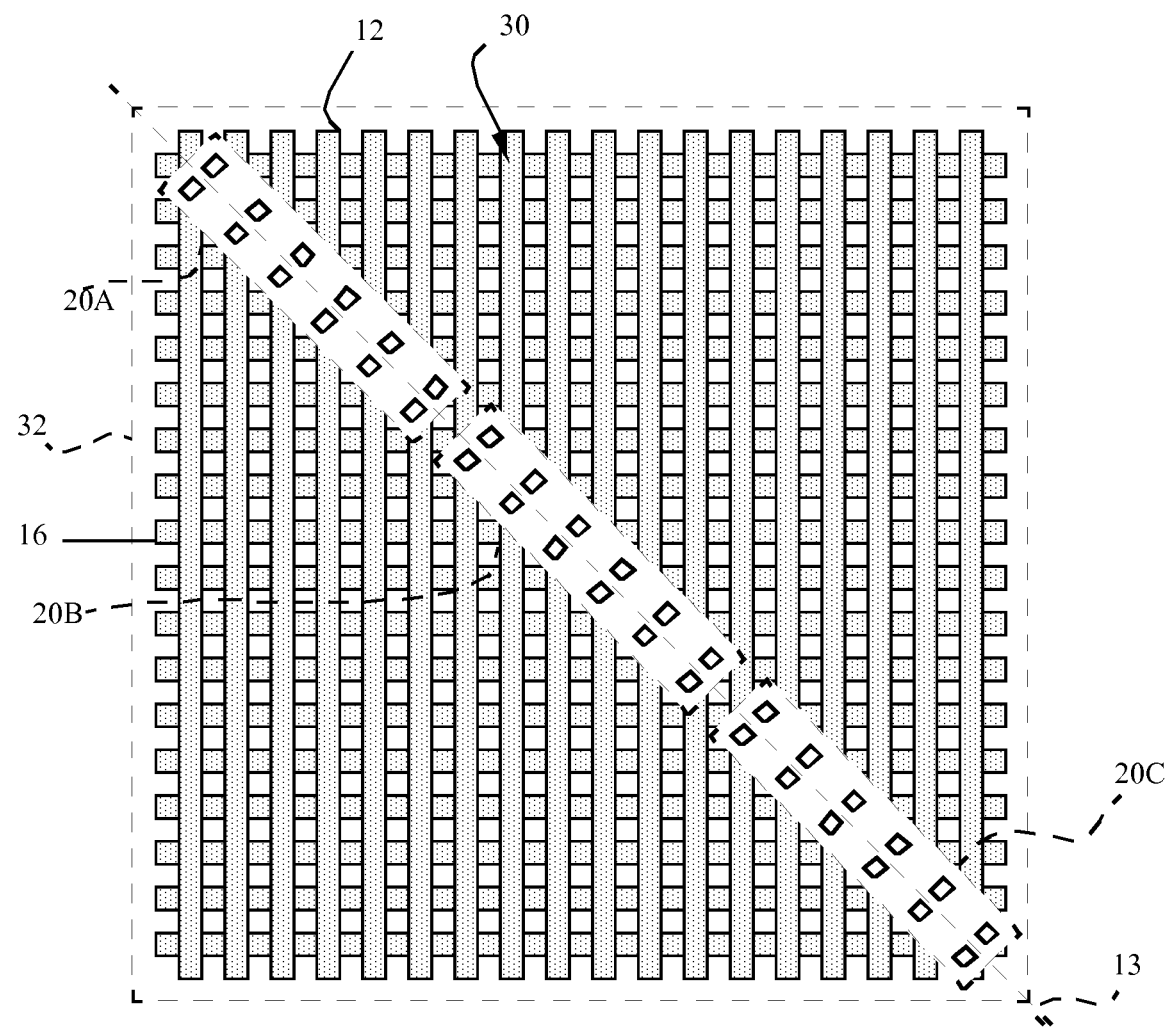
FIG. 4 is a schematic of a display device having row and column electrodes and three diagonally oriented chiplets according to an embodiment of the present invention.

Referring to FIG. 4, an embodiment of a display device of the present invention can include multiple chiplets (20A, 20B, 20C) distributed over the two-dimensional pixel array 32 formed by the intersections of row and column electrodes 16, 12. (Note that the chiplets are located behind the electrodes so that the electrodes can connect to the connection pads as in FIGS. 1A and 1B but the chiplets are shown in front of the electrodes for clarity of illustration in FIGS. 4, 6, and 11.) Each chiplet 20 is connected to a mutually exclusive subset of row electrodes 16 and column electrodes 12. As shown in FIG. 4, chiplet 20A is connected to the top 6 row electrodes 16 in the two-dimensional pixel array 32 and the leftmost 6 column electrodes 12. Chiplet 20B is connected to the central 6 row electrodes 16 in the two-dimensional pixel array 32 and the central 6 column electrodes 12. Chiplet 20C is connected to the bottom 6 row electrodes 16 in the pixel array 32 and the rightmost 6 column electrodes 12. Hence, the pixel array 32 has 18 by 18 or 324 elements controlled by three chiplets 20 with 12 connection pads each. A careful examination of FIG. 4 shows that each chiplet 20 controls a separate group of row and column electrodes 16, 12.

Figure 5:
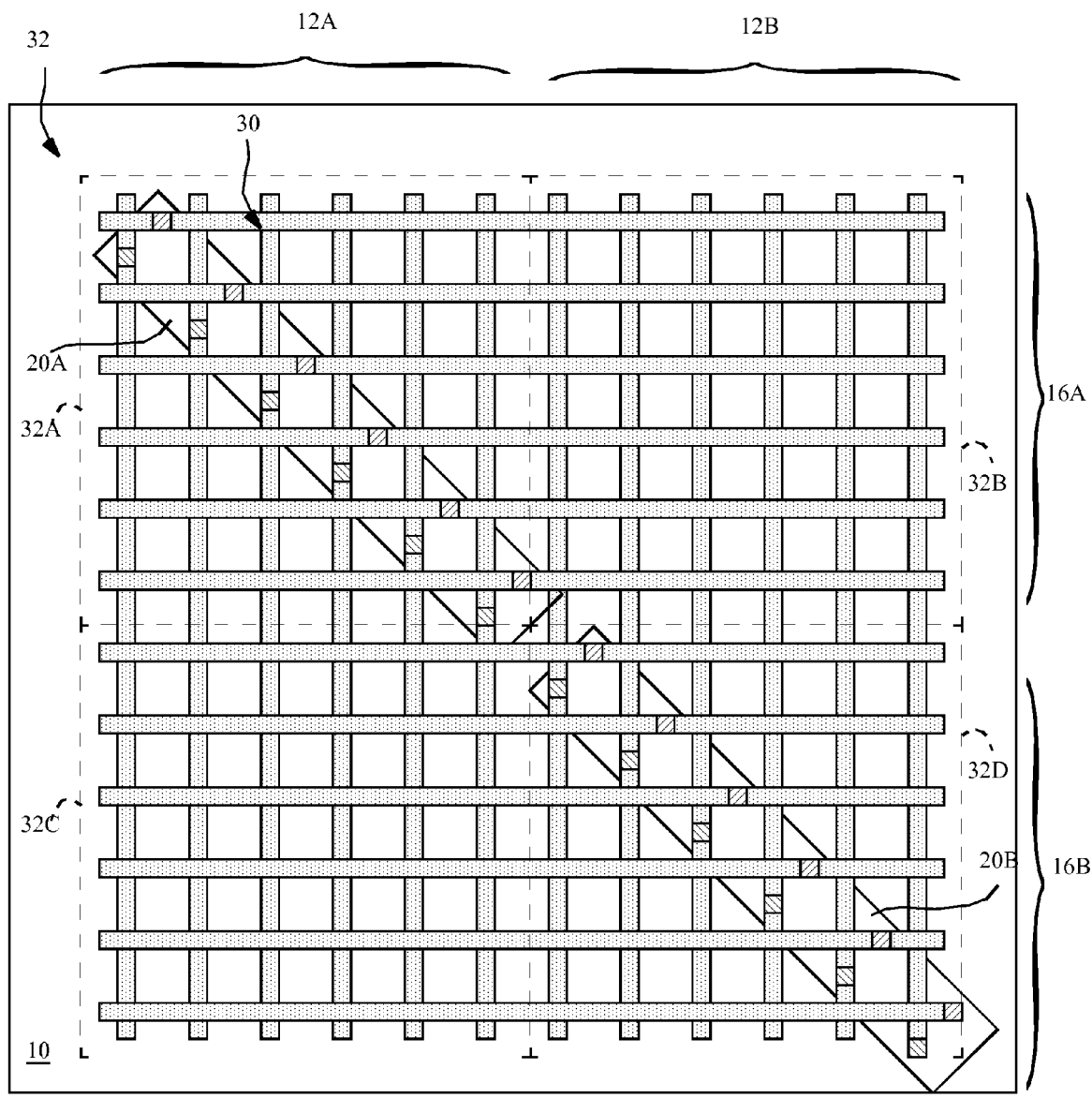
FIG. 5 is a schematic of a display device having a pixel array divided into mutually exclusive sub-arrays and two diagonally oriented chiplets according to an embodiment of the present invention.

FIG. 5 is a more detailed illustration having only two chiplets 20A and 20B. Chiplet 20A is connected to row electrodes 16A and column electrodes 12A. Chiplet 20B is connected to row electrodes 16B and column electrodes 12B. Therefore, chiplet 20A controls a first pixel subset 32A and chiplet 20B controls a first pixel subset 32D. Chiplet 20A controls only the column electrodes 12A for a second pixel subset 32C of the pixels 30 in the pixel array 32, and controls only the row electrodes 16A for a third pixel subset 32B of the pixels 30 in the pixel array 32. Similarly, chiplet 20B controls only the column electrodes 12B for a second pixel subset 32B of the pixels 30 in the pixel array 32, and controls only the row electrodes 16B for a third pixel subset 32C of the pixels 30 in the pixel array 32. The pixel subsets 32A, 32B, 32C, 32D are mutually exclusive. Hence, chiplet 20A has complete control over the pixels 30 in pixel subset 32A, since chiplet 20A controls both the row electrodes 16A and the column electrodes 12A necessary to control the pixels 30 in the pixel subset 32A. Similarly, chiplet 20B has complete control over the pixels 30 in pixel subset 32D, since chiplet 20B controls both the row electrodes 16B and the column electrodes 12B necessary to control the pixels 30 in the pixel subset 32D. Therefore, row electrodes 16A and 16B are electrically independent, and column electrodes 12A and 12B are electrically independent. However, both chiplet 20A and chiplet 20B acting in concert control the pixels 30 in pixel subsets 32B and 32C. This control is provided by circuitry 22 in the chiplets 20. Since pixel subsets 32A and 32D are completely controlled, they are referred to as directly driven pixel arrays, whereas pixel subsets 32B and 32C are referred to as indirectly driven pixel arrays.

The present invention provides reduced costs over the prior art. For example, if a conventional, active-matrix backplane were employed to drive the 324 pixels 30 of FIG. 4, a relatively low-performance and expensive thin-film semiconductor backplane would be necessary. The present invention instead employs a few high-performance, inexpensive chiplets to drive the pixels 30.

Figure 6:
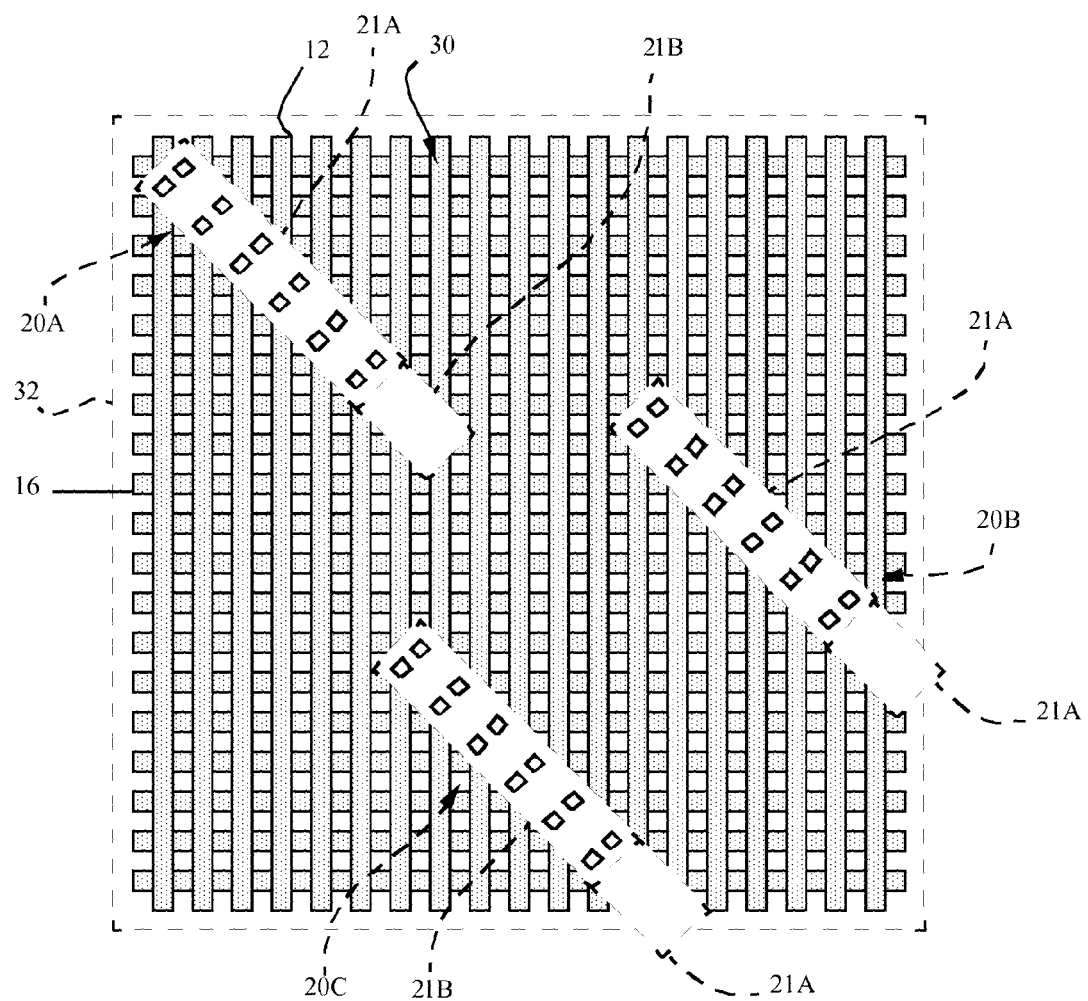
FIG. 6 is a schematic of a display device having a pixel array and three diagonally oriented chiplets with an alternative distribution according to an alternative embodiment of the present invention.

A large variety of chiplet layouts can be employed in various embodiments of the present invention. As shown in FIGS. 3A, 3B, 4, and 5, the chiplets 20 are located on a diagonal 13 of the pixel array 32. Adjacent chiplets 20 control adjacent second subsets of column electrodes and adjacent chiplets control adjacent third subsets of row electrodes. As intended herein, a diagonal is a line that is slanted or oblique with respect to either the row electrodes or the column electrodes or both. However, it is not necessary that the chiplets 20 be arranged in a single diagonal line. Referring to FIG. 6 and compared to FIG. 4, the chiplets 20 are located on a plurality of spaced-apart diagonals. Chiplet 20A controls the topmost 6 row electrodes and leftmost 6 column electrodes (as in FIG. 4). However, chiplet 20B controls the rightmost 6 column electrodes and the central 6 row electrodes. Chiplet 20C controls the central 6 column electrodes and the bottom 6 row electrodes. This alternative arrangement is useful because it separates and provides more space for the chiplets 20. In particular, if the circuitry in the chiplets takes significant space within the chiplet so that, for example the chiplets 20 have a display connection portion 21A at one end of the chiplet 20 and a control circuitry connection portion 21B at the other end of the chiplet 20, a chiplet 20 arrangement that spaces the chiplets farther apart is useful. In an alternative design (see FIGS. 12A, 12B, and 13), a display connection portion 21A can be located at each end of the chiplet 20 and a control circuitry connection portion 21B in the middle of the chiplet 20.

Figure 7:
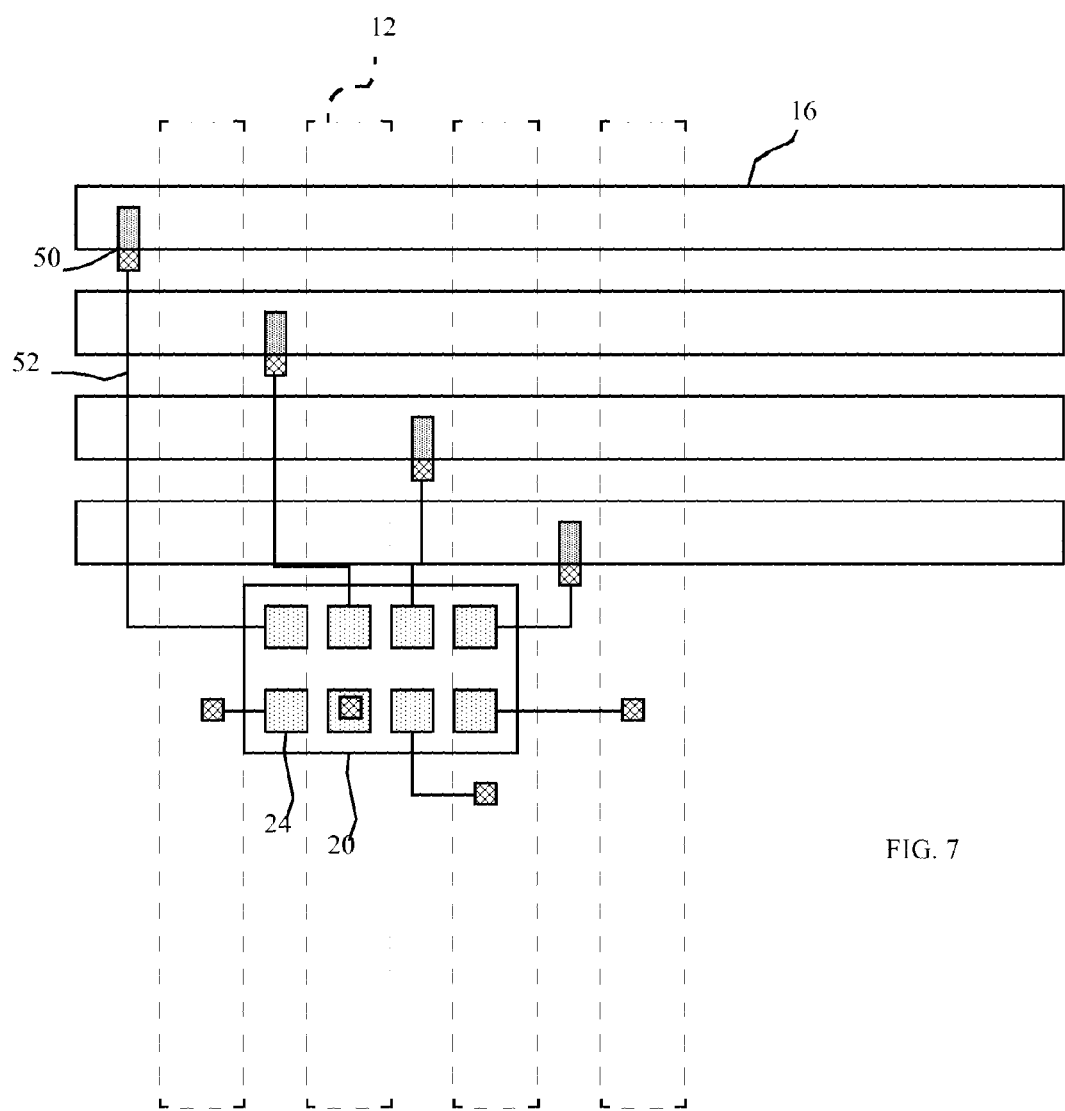
FIG. 7 is a schematic of a display device having row and column electrodes connected with vias to chiplet connection pads according to another embodiment of the present invention.

In a further embodiment of the present invention, the chiplets are not laid out on diagonal lines of the pixel array 32. Although diagonal arrangements are useful for minimizing interconnection lengths, they require careful alignment with respect to the connection pads 24 and row and column electrodes 16, 12. Moreover, the spacing of the row and column electrodes 16, 12 can cause the chiplets 20 to be larger than necessary, as illustrated in FIGS. 3A, 3B, 4, 5, and 6, for example. Referring to FIG. 7, in another embodiment of the present invention, the chiplets 20 can be aligned in any orientation with respect to the pixel array 32 and substrate 10, including aligning an edge of a chiplet 20 with a row or column electrode 16 or 12. The chiplet can have a long dimension D1 and a short dimension D2, and the long dimension D1 can be parallel to the first direction or the second direction (FIG. 10B) of the row or column electrodes, respectively.

Indeed, different chiplets 20 can be differently aligned. As shown in FIG. 7, a long dimension of a chiplet 20 is aligned with row electrodes 16. Connection pads 24 are connected with wiring to the column electrodes 12 and row electrodes 16. Vias 50 can be employed to connect from one wiring layer to another and are formed between, for example, the row electrodes 16 to avoid electrical shorts with the column electrodes 12. Since considerable wiring 52 can be necessary to electrically connect the connection pads 24 to the row and column electrodes 16, 12, a top emitter configuration can be preferred, in which the top electrode (e.g. 16 in FIGS. 1A and 1B) is transparent and the bottom electrode (e.g. 12 in FIGS. 1A and 1B) can be reflective. The substrate 10 can also be opaque.

Figure 8:
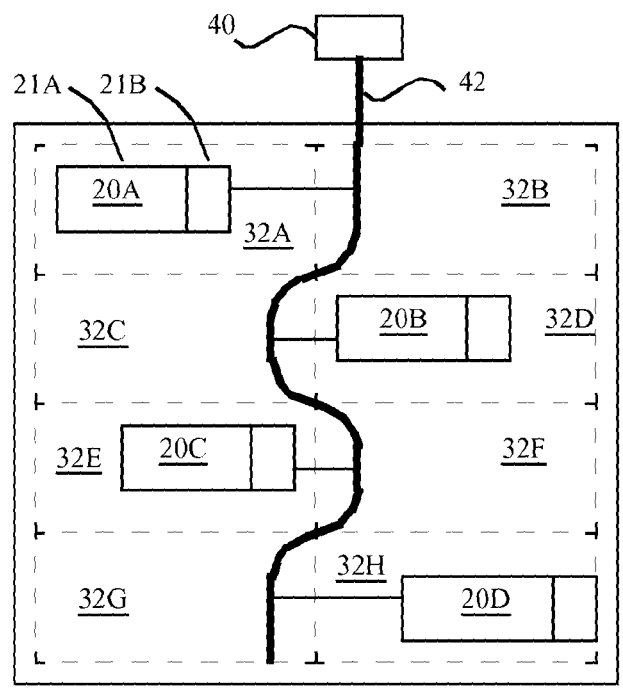
FIG. 8 is a schematic of a display device having multiple chiplets and a buss routed to avoid the chiplet devices according to another embodiment of the present invention.
Figure 9:
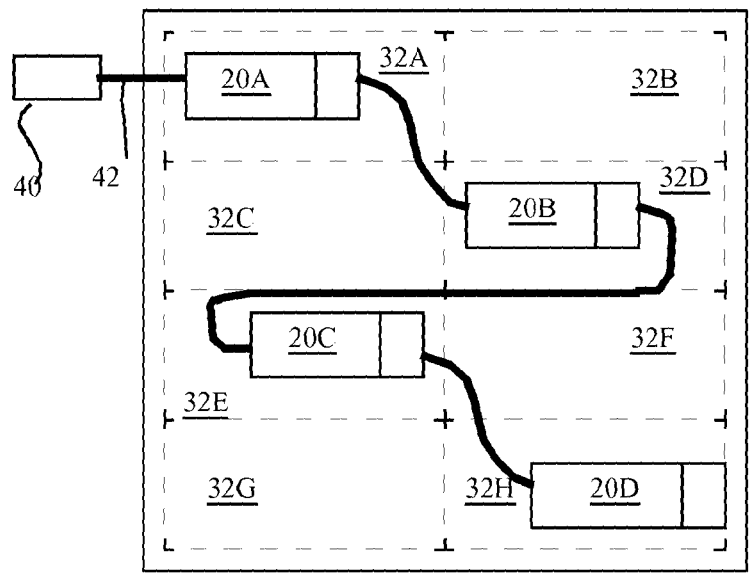
FIG. 9 is a schematic of a display device having multiple chiplets connected by a buss according to another embodiment of the present invention.
Figure 10A:
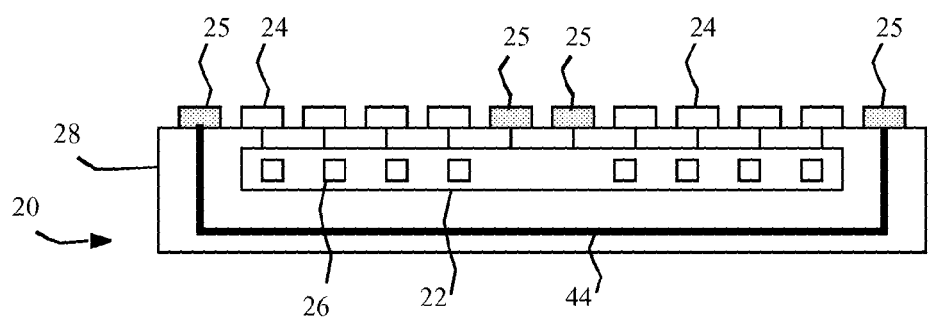
FIG. 10A is a cross section of a chiplet having different connection pads according to another embodiment of the present invention.
Figure 10B:
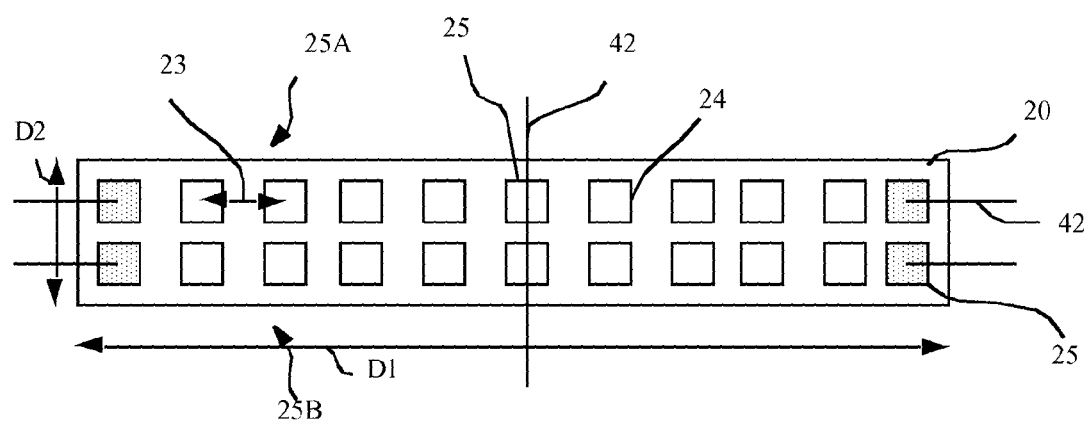
FIG. 10B is a top view of FIG. 10A in an embodiment of the present invention.

Referring to FIG. 8 in another embodiment of the present invention, the chiplets 20 can be connected to an external controller 40 through a buss 42. The buss 42 can be a serial, parallel, or point-to-point buss and can be digital or analog. A serial buss, shown in FIG. 9, is one in which data is retransmitted from one chiplet to the next on an electrically separate electrical connection. A parallel buss, shown in FIG. 8, is one in which data is simultaneously broadcast to all of the chiplets on an electrically common electrical connection. The buss 42 is connected to the chiplets to provide signals, such as power, ground, data, or select signals. More than one buss 42 can be employed. The chiplets 20 can have a pixel connection portion 21A at one end of the chiplet 20 and a circuitry portion 21B connected to a buss 42 at the other end. Referring to FIGS. 10A and 10B, each chiplet can have a first group of connection pads 24 connected to the row and column electrodes and second group of connection pads 25 connected to the control buss, wherein the first and second groups of connection pads are spatially separated. As shown in FIGS. 10A and 10B, each chiplet also can have a third group of connection pads 25 in the center of the chiplet connected to a control buss; the first, second, and third groups of connection pads are spatially separated.

Alternatively, no separate chiplet portions can be employed. Referring to FIGS. 10A, 10B, additional connection pads 25 for connecting to a buss 42 can also be provided in the chiplet 20 and can be located at a circuitry portion of a chiplet or at either end of the long dimension D1 of a chiplet 20, or in the center of the chiplet 20. Internal chiplet connections 44 can be employed to route buss connections from one end of a chiplet 20 to another end.

Referring back to FIG. 8, a chiplet arrangement corresponding to that shown in FIG. 5 is illustrated. This arrangement has the advantage of providing areas on the device substrate 10 that are not occupied with chiplets 10 and that can then be used for routing busses 42. For example, as shown in FIG. 8, pixel subsets 32A, 32D, 32E, and 32H forming pixel connection areas that are at least partially occupied with chiplets 20A, 20B, 20C, and 20D, respectively. In contrast, buss connection areas 32B, 32C, 32F, and 32G form buss connection areas that can be employed for routing buss 42 wires. Hence, in some embodiments of the present invention, the busses can have a serpentine path.

FIG. 8 illustrates an embodiment in which the buss 42 is connected in parallel in common to all of the chiplets 20A, 20B, 20C, and 20D. In an alternative embodiment shown in FIG. 9, serial buss 42 connections can be routed through chiplets 20A, 20B, 20C, and 20D.

Figure 11:
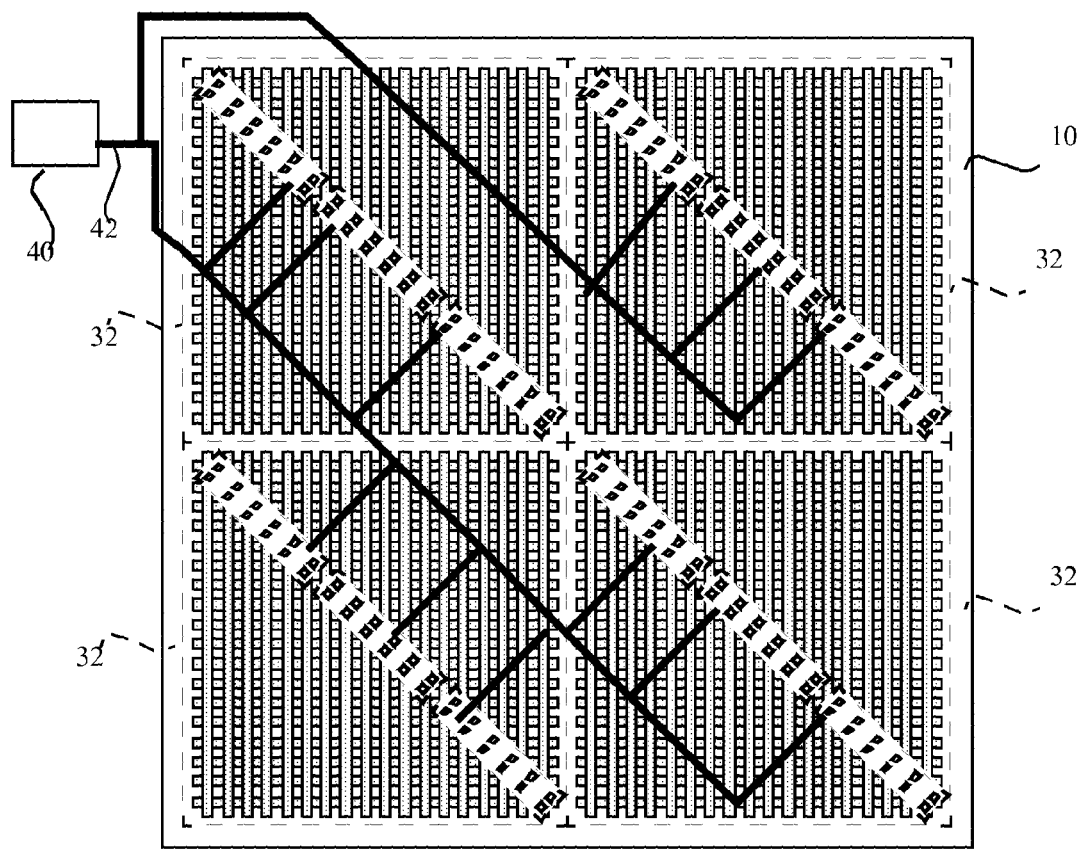
FIG. 11 is a schematic of multiple two-dimensional pixel arrays according to an embodiment of the present invention.

Referring to FIG. 11 in a further embodiment of the present invention, a plurality of two-dimensional pixel arrays 32 of pixels can be located over a common substrate 10, each two-dimensional pixel array 32 having a separate set of row electrodes 16, column electrodes 12, and chiplets 20. Hence, the structure described above can be replicated on a larger substrate 10. Each two-dimensional array structure can operate independently to reduce electrode impedance, precharge and discharge power consumption, and flicker. The structures can be connected to a common buss 42 system. Thus, in one embodiment of the present invention, a display device can include a substrate; a first layer having a plurality of arrays of row electrodes formed in rows across the substrate in a first direction and a second layer having a corresponding plurality of arrays of column electrodes formed in columns across the substrate in a second direction different from the first direction wherein the first and second electrodes overlap to form pixel locations; one or more layers of light-emitting material formed between the row and column electrodes to form two-dimensional arrays of pixels, the pixels being located in the pixel locations; and a plurality of chiplets for each array located over the substrate, the number of chiplets in each array being less than the number of pixels in the corresponding array, each array chiplet exclusively controlling a subset of row electrodes and a subset of column electrodes for the corresponding array.

FIG. 12A illustrates an embodiment in which the chiplets 20 are located in the indirectly driven pixel arrays with the control circuitry connection portion 21B of the chiplet directly under the buss wiring. The chiplet 20 has two display connection portions 21A, one on each end of the chiplet 20. Each display connection portion 21A is connected by wires to the vertical electrodes and to the horizontal electrodes in the adjacent directly driven pixel arrays. The directly driven blocks of pixels shown as shaded in FIG. 12A form a checkerboard pattern on the display, and the wiring buss forms a serpentine pattern as it is formed across the control circuitry connection portions 21B of the chiplets 20 located in the indirectly driven pixel arrays.

Figure 12B:
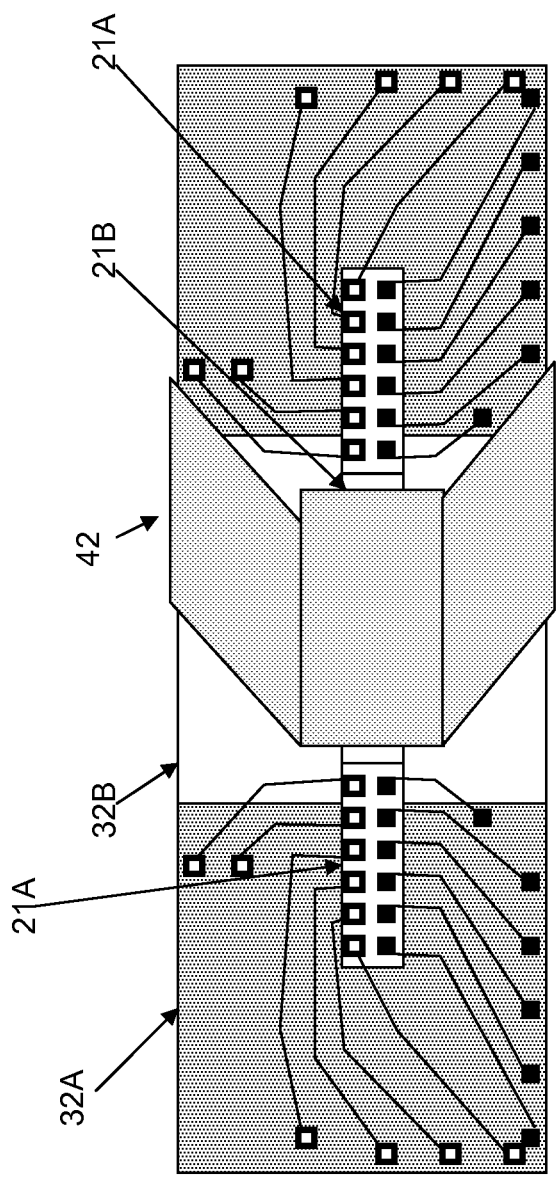
FIG. 12B is a top view of a chiplet having connections useful for understanding the illustration of FIG. 12A.

FIG. 12B illustrates the detailed wiring connections of the display connection portion 21A of the chiplet 20 to the vertical and horizontal electrodes. This figure illustrates the simple case of 6 horizontal and 6 vertical electrodes in the directly driven pixel array. Connections on wires to the vertical electrodes are shown with shaded squares, whereas connection on wires to the horizontal electrodes are shown with open squares. A similar design will work with any number of horizontal and vertical connections.

FIG. 12A and FIG. 12B show that the electrode connection wires can be patterned to leave a wide area for the control and power bus wiring 42, thus both types of wires can be constructed in the same metal layer, reducing the cost of the display compared to designs that require 2 or more wiring layers. Thus, a control buss can be located in a third layer separate from the first and second layers used for the row and column electrodes.

An additional advantage of this design is that the wires can be patterned using low-cost methods since there is ample area available for the wiring. For example, systems developed for printed-circuit board fabrication use low-cost photo-masks and proximity exposure tools capable of making 25 um lines and 25 um spaces. These are much lower cost than TFT photo-masks and TFT stepper exposure tools. This results in a back-plane fabrication process requiring less capital expense, less operating expense, and reduced TAC time.

Referring to FIG. 10B, the connection pads have center-to-center pitch 23 spacing the connection pads apart on the chiplets. Vias (FIG. 1B) form openings that expose the connection pads to which the control buss can be connected in a first portion that extends through the openings to the connection pads. The control busses can have a separate second portion having a width greater than the pitch of the connection pads, thereby enabling buss wires with a greater width and improved conductivity.

Figure 13:
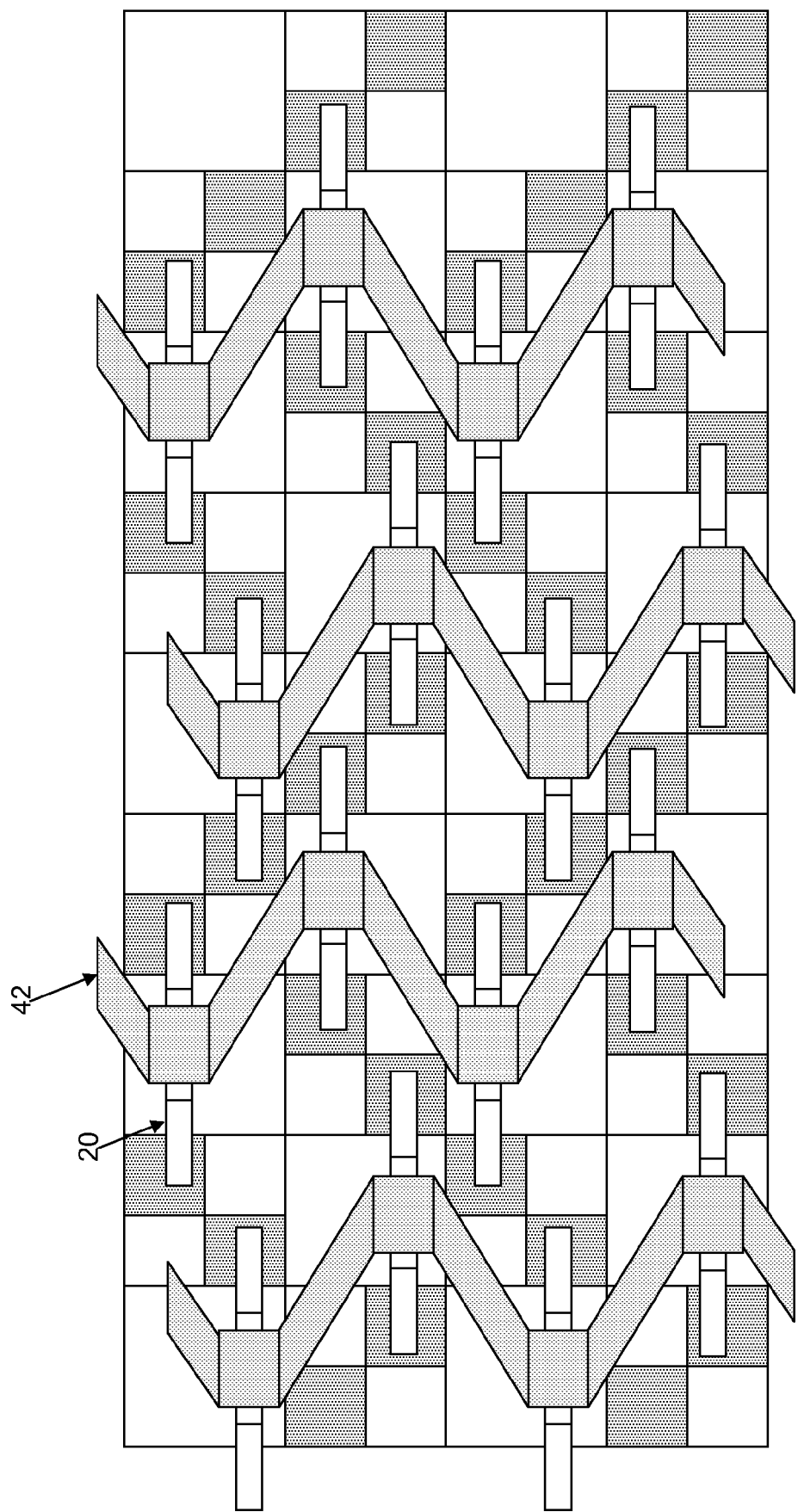
FIG. 13 is a larger-scale illustration of multiple chiplets and busses located in a serpentine fashion over a substrate, according to an embodiment of the present invention.

In some cases the physical length of the chiplet can be constrained, such as by the limits of the chiplet transfer system, or due to the number of electrical conductors that can be formed inside the chiplet. In such cases, the length of the display connection portion of the chiplets can be reduced to half, and a second serpentine line of chiplets added. This is shown in FIG. 13. In this embodiment the indirectly controlled area has been increased (shown as unshaded areas), providing more room for the control and power bus wiring, enabling processing by even less precise and lower cost methods.

Referring to FIG. 11, in operation, controller 40 receives and processes an information signal according to the needs of the display device and transmits the processed signal through one or more busses 42 to each chiplet 20 in the device. The processed signal includes luminance information for each light-emitting pixel 30 corresponding to the chiplet 20. The luminance information can be stored in a storage element 26 corresponding to each light-emitting pixel 30. The chiplets then sequentially activate the row and column electrodes to which they are connected. When both the row and column electrode for a pixel is activated, current can flow through the pixel defined by the row and column electrode to emit light. Typically, an entire row or column of electrodes within a pixel array are activated simultaneously be activating all of the column electrodes and one row electrode at once. The column electrodes are controlled to provide the individual luminance desired for each pixel in the row. Then a second row is selected and the process repeats until all of the rows are activated and all of the pixels emit light. The process can then repeat. Note that some of the pixels are controlled by one chiplet and some require two chiplets acting in concert. Note that the designation of "row" and "column" is arbitrary and the functions of row and column electrodes can be reversed.

Although the sequential activation of separate rows (or columns) in a display device can induce flicker, employing multiple, independently controlled pixel arrays 32 reduces the number of rows or columns in each separately controlled pixel array 32. Since the pixel groups 32 are simultaneously activated, flicker can be greatly reduced. Moreover, because the group row electrodes 16 and group column electrodes 12 are connected only within a pixel array 32, the group row electrodes 16 and group column electrodes 12 are short, reducing the electrode capacitance and resistance and the need for high-power driving circuitry in the chiplet 20. Hence, the portion of time that each pixel row emits light is increased, flicker is decreased, and current densities decreased at a desired luminance.

The busses 42 can supply a variety of signals, including timing (e.g. clock) signals, data signals, select signals, power connections, or ground connections. The signals can be analog or digital, for example digital addresses or data values. Analog data values can be supplied as charge. The storage elements 26 can be digital (for example including flip-flops) or analog (for example including capacitors for storing charge).

In various embodiments of the present invention, the chiplets 20 distributed over the substrate 10 can be identical. However, a unique identifying value, i.e. an ID, can be associated with each chiplet 20. The ID can be assigned before or, preferably, after the chiplet 20 is located over the substrate 10 and the ID can reflect the relative position of the chiplet 20 on the substrate 10, that is, the ID can be an address. For example, the ID can be assigned by passing a count signal from one chiplet 20 to the next in a row or column. Separate row or column ID values can be used.

The controller 40 can be implemented as a chiplet and affixed to the substrate 10. The controller 40 can be located on the periphery of the substrate 10, or can be external to the substrate 10 and include a conventional integrated circuit.

According to various embodiments of the present invention, the chiplets 20 can be constructed in a variety of ways, for example with one or two rows of connection pads 24 along a long dimension of a chiplet 20. The interconnection busses 42 or wires 52 can be formed from various materials and can use various methods for deposition on the device substrate. For example, the interconnection busses 42 or wires 52 can be metal, either evaporated or sputtered, for example aluminum or aluminum alloys. Alternatively, the interconnection busses 52 or wires 52 can be made of cured conductive inks or metal oxides. In one cost-advantaged embodiment, the interconnection busses 42 or wires 52, or both, are formed in a single layer.

The present invention is particularly useful for multi-pixel device embodiments employing a large device substrate, e.g. glass, plastic, or foil, with a plurality of chiplets 20 arranged in a regular arrangement over the device substrate 10. Each chiplet 20 can control a plurality of pixels 30 formed over the device substrate 10 according to the circuitry in the chiplet 20 and in response to control signals. Individual pixel groups or multiple pixel groups can be located on tiled elements, which can be assembled to form the entire display.

According to the present invention, chiplets 20 provide distributed pixel control elements over a substrate 10. A chiplet 20 is a relatively small integrated circuit compared to the device substrate 10 and includes a circuit 22 including wires, connection pads, passive components such as resistors or capacitors, or active components such as transistors or diodes, formed on an independent substrate 28. Chiplets 20 are separately manufactured from the display substrate 10 and then applied to the display substrate 10. The chiplets 20 are preferably manufactured using silicon or silicon on insulator (SOI) wafers using known processes for fabricating semiconductor devices. Each chiplet 20 is then separated prior to attachment to the device substrate 10. The crystalline base of each chiplet 20 can therefore be considered a substrate 28 separate from the device substrate 10 and over which the chiplet's circuitry 22 is disposed. The plurality of chiplets 20 therefore has a corresponding plurality of substrates 28 separate from the device substrate 10 and each other. In particular, the independent substrates 28 are separate from the substrate 10 on which the pixels 30 are formed and the areas of the independent, chiplet substrates 28, taken together, are smaller than the device substrate 10. Chiplets 20 can have a crystalline substrate 28 to provide higher performance active components than are found in, for example, thin-film amorphous or polycrystalline silicon devices. Chiplets 20 can have a thickness preferably of 100 um or less, and more preferably 20 um or less. This facilitates formation of the adhesive and planarization material 18 over the chiplet 20 that can then be applied using conventional spin-coating techniques. According to one embodiment of the present invention, chiplets 20 formed on crystalline silicon substrate are arranged in a geometric array and adhered to a device substrate (e.g. 10) with adhesion or planarization materials. Connection pads 24 on the surface of the chiplets 20 are employed to connect each chiplet 20 to signal wires, power busses and row or column electrodes (16, 12) to drive pixels 30. Chiplets 20 can control at least four pixels 30.

Since the chiplets 20 are formed in a semiconductor substrate, the circuitry of the chiplet can be formed using modern lithography tools. With such tools, feature sizes of 0.5 microns or less are readily available. For example, modern semiconductor fabrication lines can achieve line widths of 90 nm or 45 nm and can be employed in making the chiplets of the present invention. The chiplet 20, however, also requires connection pads 24 for making electrical connection to the wiring layer provided over the chiplets once assembled onto the display substrate 10. The connection pads 24 are sized based on the feature size of the lithography tools used on the display substrate 10 (for example 5 um) and the alignment of the chiplets 20 to the wiring layer (for example +/−5 um). Therefore, the connection pads 24 can be, for example, 15 um wide with 5 um spaces between the pads. This means that the pads will generally be significantly larger than the transistor circuitry formed in the chiplet 20.

The pads can generally be formed in a metallization layer on the chiplet over the transistors. It is desirable to make the chiplet with as small a surface area as possible to enable a low manufacturing cost. Therefore, the size and number of the connection pads and not the transistors will generally limit the size of the chiplet.

By employing chiplets with independent substrates (e.g. including crystalline silicon) having circuitry with higher performance than circuits formed directly on the substrate (e.g. amorphous or polycrystalline silicon), a device with higher performance is provided. Since crystalline silicon has not only higher performance but much smaller active elements (e.g. transistors), the circuitry size is much reduced so that the chiplet size is determined by the number and spacing of connection pads necessary to control and power the device. A useful chiplet can also be formed using micro-electro-mechanical (MEMS) structures, for example as described in "A novel use of MEMS switches in driving AMOLED", by Yoon, Lee, Yang, and Jang, Digest of Technical Papers of the Society for Information Display, 2008, 3.4, p. 13.

The device substrate 10 can include glass and the wiring layers made of evaporated or sputtered metal, e.g. aluminum or silver, formed over a planarization layer (e.g. resin) patterned with photolithographic techniques known in the art. The chiplets 20 can be formed using conventional techniques well established in the integrated circuit industry.

The present invention can be employed in devices having a multi-pixel infrastructure. In particular, the present invention can be practiced with LED devices, either organic or inorganic, and is particularly useful in information-display devices. In a preferred embodiment, the present invention is employed in a flat-panel OLED device composed of small-molecule or polymeric OLEDs as disclosed in, but not limited to U.S. Pat. No. 4,769,292 to Tang et al., and U.S. Pat. No. 5,061,569 to VanSlyke et al. Inorganic devices, for example, employing quantum dots formed in a polycrystalline semiconductor matrix (for example, as taught in U.S. Patent Application Publication No. 2007/0057263 by Kahen), and employing organic or inorganic charge-control layers, or hybrid organic/inorganic devices can be employed. Many combinations and variations of organic or inorganic light-emitting displays can be used to fabricate such a device, including active-matrix displays having either a top- or a bottom-emitter architecture.

The invention has been described in detail with particular reference to certain preferred embodiments thereof, but it should be understood that variations and modifications can be effected within the spirit and scope of the invention.

PARTS LIST

D1 long dimension
D2 short dimension
10 substrate
12 column electrode
12A, 12B column electrode group
13 diagonal
14 light-emissive material
15 light-emitting diode
16 row electrode
16A, 16B row electrode group
18 planarization layer
20 chiplet
20A, 20B, 20C, 20D chiplet
21A display connection portion
21B control circuit connection portion
22 circuitry
23 connection pad pitch
24 connection pad
24A column connection pad
24B row connection pad
25 buss connection pad
25A, 25B row of connection pads
26 storage element
28 chiplet substrate
30 pixel
32 two-dimensional pixel array
32A, 32B, 32C, 32D, 32E, 32F, 32G, 32H pixel subsets
40 controller
42 buss
44 internal chiplet connection
50 via
52 wire

The invention claimed is:

1. A display device, comprising:
    (a) a substrate;
    (b) a first layer having an array of row electrodes formed in rows across the substrate in a first direction and a second layer having an array of column electrodes formed in columns across the substrate in a second direction different from the first direction wherein the row and column electrodes overlap to form pixel locations;
    (c) one or more layers of light-emitting material formed between the row and column electrodes to form a two-dimensional array of pixels, the pixels being located in the pixel locations; and
    (d) a plurality of chiplets located over the substrate, the number of chiplets being less than the number of pixels, each chiplet exclusively controlling a subset of row electrodes and a subset of column electrodes, whereby the pixels are controlled to display an image.

2. The display device of claim 1, wherein each chiplet has a storage element for at least each pixel to which it is connected in a subset row or column, the storage element storing a value representing a desired luminance for each pixel and the chiplet using such value to control the row electrodes or column electrodes connected to the pixel.

3. The display device of claim 1, wherein a first chiplet controls the column electrodes for a first subset of pixels and a second chiplet controls the row electrodes for the first subset of pixels.

4. The display device of claim 3, wherein a chiplet controls the both the column electrodes for a second subset of pixels different from the first subset and the row electrodes for the second subset of pixels.

5. The display device of claim 3, wherein the chiplets are located on the substrate on a diagonal of the pixel array.

6. The display device of claim 5, wherein the chiplets are located on a plurality of spaced-apart diagonals of the pixel array.

7. The display device of claim 1, further comprising a controller for controlling signals transmitted to the chiplets through one or more busses.

8. The display device of claim 1, including one or more serial or parallel buss connections electrically connected to each chiplet.

9. The display device of claim 8, wherein a buss provides a power or ground electrical connection or a buss transmits a data signal or a control signal.

10. The display device of claim 1, further including a control buss and wherein each chip let has a first group of connection pads connected to the row and column electrodes and second group of connection pads connected to the control buss, wherein the first and second groups of connection pads are spatially separated.

11. The display device of claim 10, wherein each chiplet has a third group of connection pads connected to the control buss, wherein the first, second, and third groups of connection pads are spatially separated.

12. The display device of claim 10, wherein each chiplet further includes a third group of connection pads connected to the row and column electrodes wherein the first, second, and third groups of connection pads are spatially separated.

13. The display device of claim 1, wherein the chiplet has a long dimension and a short dimension and wherein the long dimension is parallel to the first direction or the second direction.

14. The display device of claim 1, wherein each chiplet has two rows of connection pads and wherein one row of connection pads is connected to the corresponding row electrodes and one row of connection pads is connected to the corresponding column electrodes.

15. The display device of claim 1, further including a third layer separate from the first and second layers and a control buss located in the third layer.

16. The display device of claim 15, further comprising spaced apart connection pads having a pitch formed on the chip lets and openings formed to expose the connection pads and wherein the control buss has a first portion that extends through the openings to the connection pads, and a separate second portion having a width greater than the pitch of the connection pads.

17. A display device, comprising:
(a) a substrate;
(b) a first layer having a plurality of electrically independent arrays of row electrodes formed in rows across the substrate in a first direction and a second layer having a corresponding plurality of electrically independent arrays of column electrodes formed in columns across the substrate in a second direction different from the first direction wherein the first and second electrodes overlap to form pixel locations;
(c) one or more layers of light-emitting material formed between the row and column electrodes to form two-dimensional arrays of pixels, the pixels being located in the pixel locations; and
(d) a plurality of chiplets for each two-dimensional pixel array located over the substrate, the number of chiplets for each two-dimensional pixel array being less than the number of pixels in the corresponding two-dimensional pixel array, each array chiplet exclusively controlling a subset of row electrodes and a subset of column electrodes for the corresponding two-dimensional pixel array.

* * * * *